United States Patent
Haag et al.

(10) Patent No.: US 7,855,426 B2
(45) Date of Patent: Dec. 21, 2010

(54) OPTICAL SENSOR ASSEMBLAGE AND CORRESPONDING MANUFACTURING METHOD

(75) Inventors: Frieder Haag, Wannweil (DE); Ronny Ludwig, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 936 days.

(21) Appl. No.: 10/561,635

(22) PCT Filed: May 15, 2004

(86) PCT No.: PCT/DE2004/001027

§ 371 (c)(1),
(2), (4) Date: Mar. 29, 2007

(87) PCT Pub. No.: WO2004/114403

PCT Pub. Date: Dec. 29, 2004

(65) Prior Publication Data

US 2007/0272993 A1 Nov. 29, 2007

(30) Foreign Application Priority Data

Jun. 20, 2003 (DE) ................. 103 27 694

(51) Int. Cl.
*H01L 31/00* (2006.01)
*H01L 31/0232* (2006.01)
*H01L 31/0203* (2006.01)
*H01L 23/495* (2006.01)

(52) U.S. Cl. ............... 257/434; 257/440; 257/432; 257/666

(58) Field of Classification Search ........... 257/98–100, 257/431–437, 680, 685–686, 666–668, 777–787, 257/E31, E21
See application file for complete search history.

(56) References Cited

U.S. PATENT DOCUMENTS

| | | | |
|---|---|---|---|
| 6,674,159 B1 * | 1/2004 | Peterson et al. | 257/680 |
| 6,844,606 B2 * | 1/2005 | Logsdon et al. | 257/434 |
| 2002/0139410 A1 | 10/2002 | Wilner et al. | |

FOREIGN PATENT DOCUMENTS

| | | |
|---|---|---|
| EP | 1 211 721 | 6/2002 |
| JP | 2702095 | 2/1996 |
| JP | 2006-187919 | 7/2006 |
| WO | 03 067 657 | 8/2003 |

* cited by examiner

Primary Examiner—Cuong Q Nguyen
(74) Attorney, Agent, or Firm—Kenyon & Kenyon LLP

(57) ABSTRACT

An optical sensor assemblage, in particular a thermopile sensor assemblage, comprising a sensor chip assemblage having an optically transparent irradiation region, a mounting region surrounding the latter, and a wire-bond region; an optically isolating mounting frame having a chip receiving region and a plurality of connector elements; and an optically isolating packaging device; the sensor chip assemblage being joined in the mounting region to the chip receiving region, and in the wire-bond region to one or more of the connector elements, the chip receiving region having a window disposed in such a way that at least a portion of the optical irradiation region is not covered by the chip receiving region; and the packaging device surrounding the sensor chip assemblage and the mounting frame in such a way that optical radiation can enter the sensor chip assemblage substantially only through the window.

18 Claims, 10 Drawing Sheets

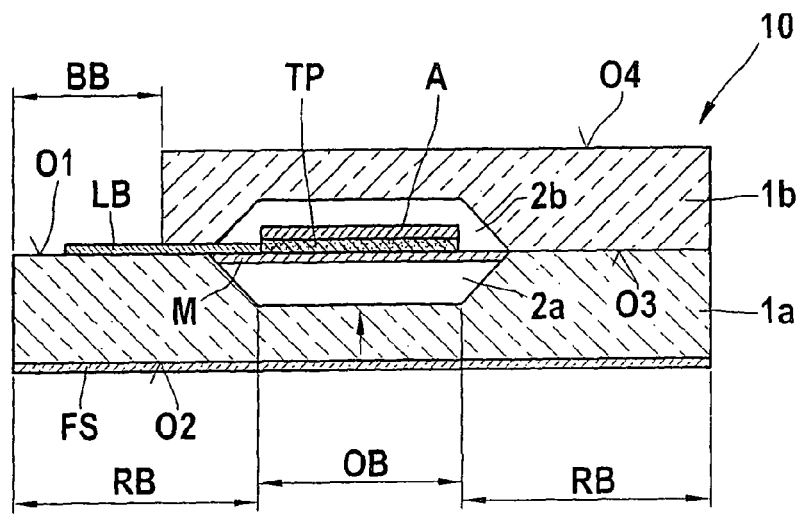
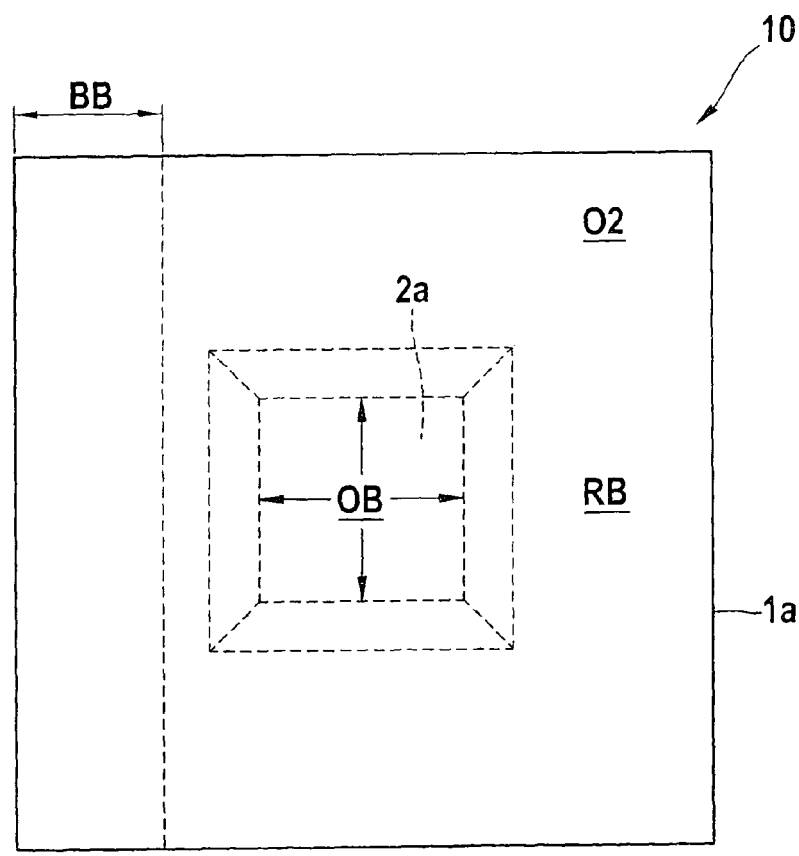

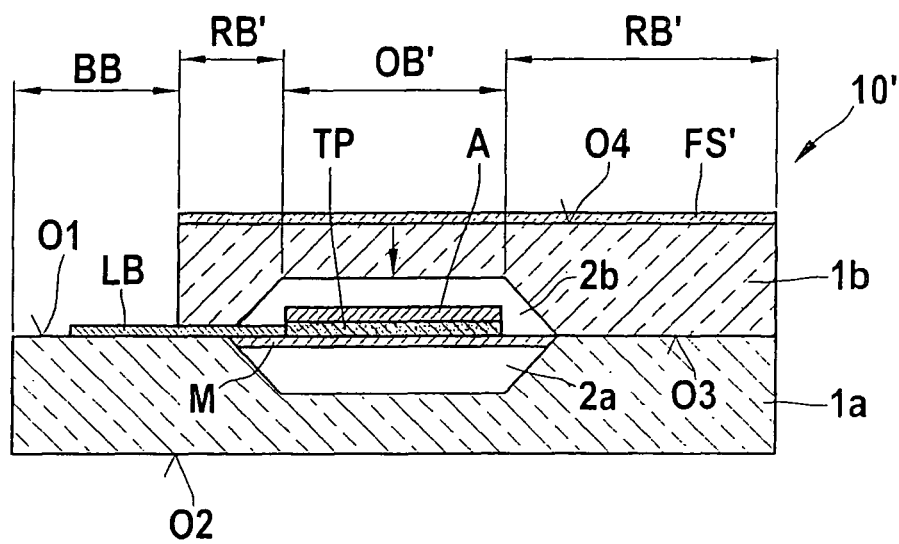
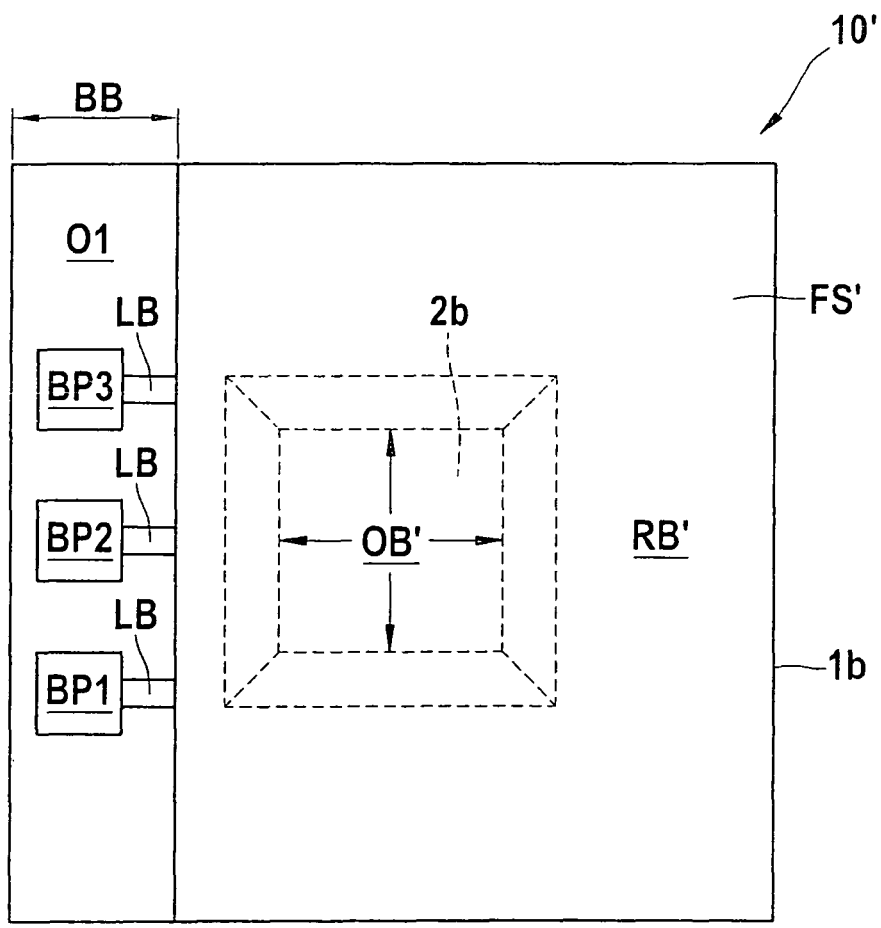

OPTICAL SENSOR ASSEMBLAGE AND CORRESPONDING MANUFACTURING METHOD

FIELD OF THE INVENTION

The present invention relates to an optical sensor assemblage and a corresponding manufacturing method.

BACKGROUND INFORMATION

Although applicable to any optical sensor assemblages, the present invention and the problem on which it is based will be explained with reference to a thermopile sensor assemblage.

Thermopile sensors belong to the group of thermal radiation sensors, i.e. an incident radiation results in a temperature difference between a receiver surface and a difference region (heat sink). This temperature difference is converted into an electrical voltage with thermoelements, on the basis of the Seebeck effect. The output voltage depends not on the geometric dimensions of the thermoelements, but only on the material combination selected. The output voltage of the thermopiles thus implemented is increased by serially connecting multiple identically irradiated thermoelements.

Using micromechanical technologies, it is possible to manufacture the thermopiles as silicon chips, similarly to conventional semiconductor components and using typical semiconductor processes. The application of multi-level technologies additionally permits a further reduction in the geometric dimensions of the thermopiles. To achieve maximum sensitivity, the thermopiles are provided on a thermally insulating membrane that is as free-standing as possible. An etched silicon frame serves as carrier for the membrane and simultaneously as a thermal reference medium.

Conventional micromechanical thermopile sensors with, for example, an infrared filter for gas detection are installed in TO05 or TO08 packages having optical windows. The thermopile element sits with its optically inactive side on the housing base, while the filters are adhesively bonded in the TO cap. Essential sensor properties such as sensitivity, time constant, and acquired spectral range can be influenced, during packaging of the sensors in hermetic metal housings of this kind, by selection of the filter medium and window material. This type of housing is very expensive and is also no longer hermetically sealed because of the necessary openings in the cap. There is generally no passivation of the bonding wires, which calls into question suitability for outdoor applications, in particular automobile applications, due to condensation, corrosion, etc.

Also known are completely injection-embedded or molded sensors, e.g. micromechanical acceleration sensors. Here the sensor element is secured (adhesively bonded or soldered) at its inactive rear side onto a carrier strip (lead frame). Wire-bond connections are used to create an electrical contact on contact surfaces (called "leads") provided therefor on the rim of the chip mounting surface. The lead frame is then injection-embedded or molded using a plastic compound or molding compound. Because the molding compound is insufficiently transparent in the frequency range of interest for thermopile sensors for gas detection (e.g. in the infrared region at wavelengths greater than or equal to 4000 nm), optical access to the sensor would no longer exist with an installation technique of this kind (complete injection embedding).

Lastly, IC housings for power ICs, having an exposed chip installation region (called a "die pad") on the rear side for purposes of better heat dissipation, are known.

SUMMARY OF THE INVENTION

The advantage, as compared with the known approaches to a solution, make possible simple and very economical assembly with all the bonded connections being passivated. This yields a sensor suitable for automobile applications.

The underlying idea of the present invention is to provide a packaging device, for example in the form of a moldable housing, having an optically open region, in the form of a window on the chip mounting surface, in which is provided an optical sensor that is exposed substantially only through the window to optical radiation that is to be detected.

As compared with a known package having a cavity on the upper side, in which context assembly tolerances in the configuration can be very large and a male die must protect the active chip surface from the molding compound, with the sensor assemblage according to the present invention there is no need for a male die that presses directly onto the chip and might possibly damage it. Only the window in the chip receiving region must be protected from the packaging material (e.g. plastic or molding compound). Passivation using a non-transparent standard molding compound is possible, so that no further passivation material is needed. In the case of mounting onto a substrate, the possibility exists of applying further optical filters onto the substrate or the package itself. Replaceable or retrofittable filters, for example, can thus be provided.

According to a preferred development, the sensor chip assemblage has a first chip having a first and a second oppositely located surface, and a second chip having a third and a fourth oppositely located surface, which chips are joined via the first and the third surface and enclose a cavity in which the sensor structure is disposed; and the first chip has on the first surface a contact region for wire bonds which protrudes laterally beyond the second chip (bonding region) and onto which at least one bonding wire bonded to a connector element (lead) is guided.

According to a further preferred development, the optically transparent irradiation region and the surrounding mounting region are provided on the second surface (base surface) of the first chip.

According to a further preferred development, the optically transparent irradiation region and the surrounding mounting region are provided on the fourth surface of the second chip.

According to a further preferred development, the chip receiving region (e.g. the die pad of a lead frame that is used) has a fifth and a sixth oppositely located surface, the fifth surface being joined to the mounting region.

According to a further preferred development, the sixth surface is not covered by the packaging device and lies in one plane with a lower side of the packaging device.

According to a further preferred development, the connector elements protrude out of oppositely located lateral surfaces of the packaging device, their ends lying (e.g. in accordance with the standard for molded housings) in the plane of the lower side.

According to a further preferred development, the sixth surface and the ends of the connector elements are joined (e.g. adhesively bonded or soldered) to a substrate that has a through hole in the region of the window.

According to a further preferred development, the sixth surface is partially covered by the packaging device, and a lower side of the packaging device lies in a plane below the sixth surface.

According to a further preferred development, an optical filter device is provided on the second or fourth surface of the first chip and/or on the substrate in the region of the through hole.

BRIEF DESCRIPTION OF THE DRAWINGS

FIGS. 1a-d show a first embodiment of the sensor apparatus according to the present invention and its configuration.

FIGS. 3a-d show a third embodiment of the sensor apparatus according to the present invention and its configuration.

DETAILED DESCRIPTION

Figure 1C:
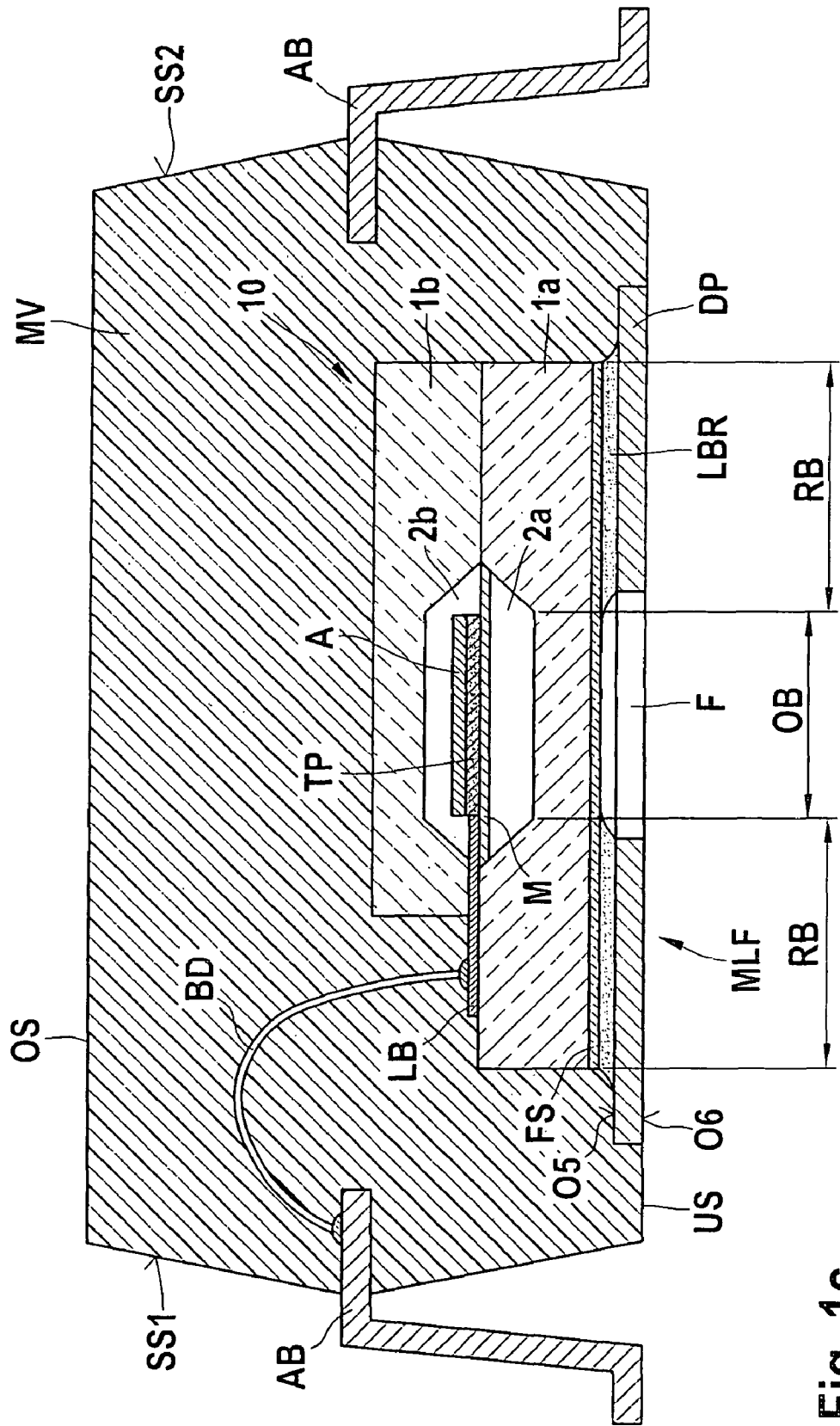

The embodiments below describe, with no limitation of generality, an optical sensor assemblage for an optical thermopile sensor for automobile applications. The examples concern in particular a micromechanical optical thermopile sensor having an integrated filter for detecting infrared radiation in the wavelength region greater than or equal to 4000 nm, for gas detection ($CO_2$ sensor).

FIGS. 1a-d show a first embodiment of the sensor apparatus according to the present invention and its configuration.

In FIG. 1a, reference number 10 designates in general an optical sensor assemblage in the form of a thermopile sensor assemblage. Sensor assemblage 10 encompasses a lower chip 1a having a cavity 2a above which is provided a membrane M. Applied on membrane M are thermopile sensor elements TP and an absorber layer A located thereabove. By way of a conductive strip LB, an electrical connection is guided from thermopile elements TP into the outer rim region of first chip 1a, which hereafter will also be referred to as wire-bond region BB.

A second chip 1b is bonded with its surface O3 onto upper surface O1 of first chip 1a as a cap, second chip 1b likewise having a cavity 2b that is oriented toward cavity 2a of the first chip. Second chip 1b is dimensioned and oriented in such a way that it leaves wire-bond region BB of first chip 1a exposed. Filter layers FS for filtering out specific wavelengths are applied onto lower surface O2 of first chip 1a.

It may be noted with regard to this first embodiment that the silicon of first and second chips 1a, 1b is sufficiently transparent for the optical wavelengths in the middle infrared region that are to be sensed. In usual thermopile elements TP, the optical radiation to be sensed is directed directly onto absorber layer A. With the configuration according to FIG. 1, this would mean that the optical radiation would need to be directed toward upper surface O4 of second chip 1b.

In contrast to this usual procedure, however, in this first embodiment optical irradiation region OB is defined on surface O2 and extends, because of the configuration, over the diameter of absorber layer A and of thermopile elements TP located therebelow. Experiments have indicated that the losses occurring because of this type of irradiation due to thermopile elements TP themselves are relatively small, and constitute only a few percent of the total radiation yield.

The central optical irradiation region OB on surface O2 is surrounded annularly by a mounting region RB that is employed, as explained in detail below, for mounting of this sensor assemblage 10, the optical irradiation region being left exposed.

FIG. 1b is a plan view of surface O2 of first chip 1a (without filter layer FS). Cavity 2a, optical irradiation region OB, mounting region RB, and wire-bond region BB located on the oppositely located surface O1 are highlighted by the dashed lines.

According to FIG. 1c, sensor assemblage 10 according to FIGS. 1a, b is adhesively bonded or soldered, by a mounting region LBR, onto a mounting frame MLF in the form of a usual lead frame. Mounting frame MLF encompasses for that purpose a chip receiving region DP equipped with a window F, as well as a plurality of connector elements or connector legs AB. Not depicted in the sectioned view of FIG. 1c is the suspension of chip receiving region DP on corresponding connector elements, usually in the corners of mounting frame MLF.

Upon assembly of sensor chip assemblage 10, mounting region RB that annularly surrounds optical irradiation region OB is joined to chip receiving region DP in such a way that optical irradiation region OB is not covered by chip receiving region DP, i.e. is exposed toward the outside through window F.

In addition, connector elements AB are connected via corresponding bonding wires BD to conductor path LB and to further conductor paths (not shown) on corresponding bonding surfaces.

In a subsequent step, after completion of all the connecting operations and soldering or adhesive bonding operations, sensor assemblage 10 is injection-embedded into a molded package MV. In this context, lower side US of molded package MV extends in one plane substantially flush with a lower surface O6 of chip receiving region DP, surface O6 being located opposite a surface O5 onto which mounting region RB of chip 1a is mounted. The join between chip 1a and chip receiving region DP must be sealed for the molding process.

Connector elements AB project out of lateral surfaces SS1, SS2 of molded package MV whose planar upper side is labeled OS, and are bent upward or downward in usual fashion.

This type of assembly yields a sensor assemblage 10 in which optical radiation can be incident onto thermopile elements TP and absorber layer A substantially only through window F, since molded package MV and the metallic mounting frame MLF are not transparent to, or have a shielding effect on, the relevant optical radiation.

Lower side US of molded package MV is also substantially in one plane with the ends of connector elements AB' (in accordance with the JEDEC standard for SOP-form molded housings).

Figure 1D:
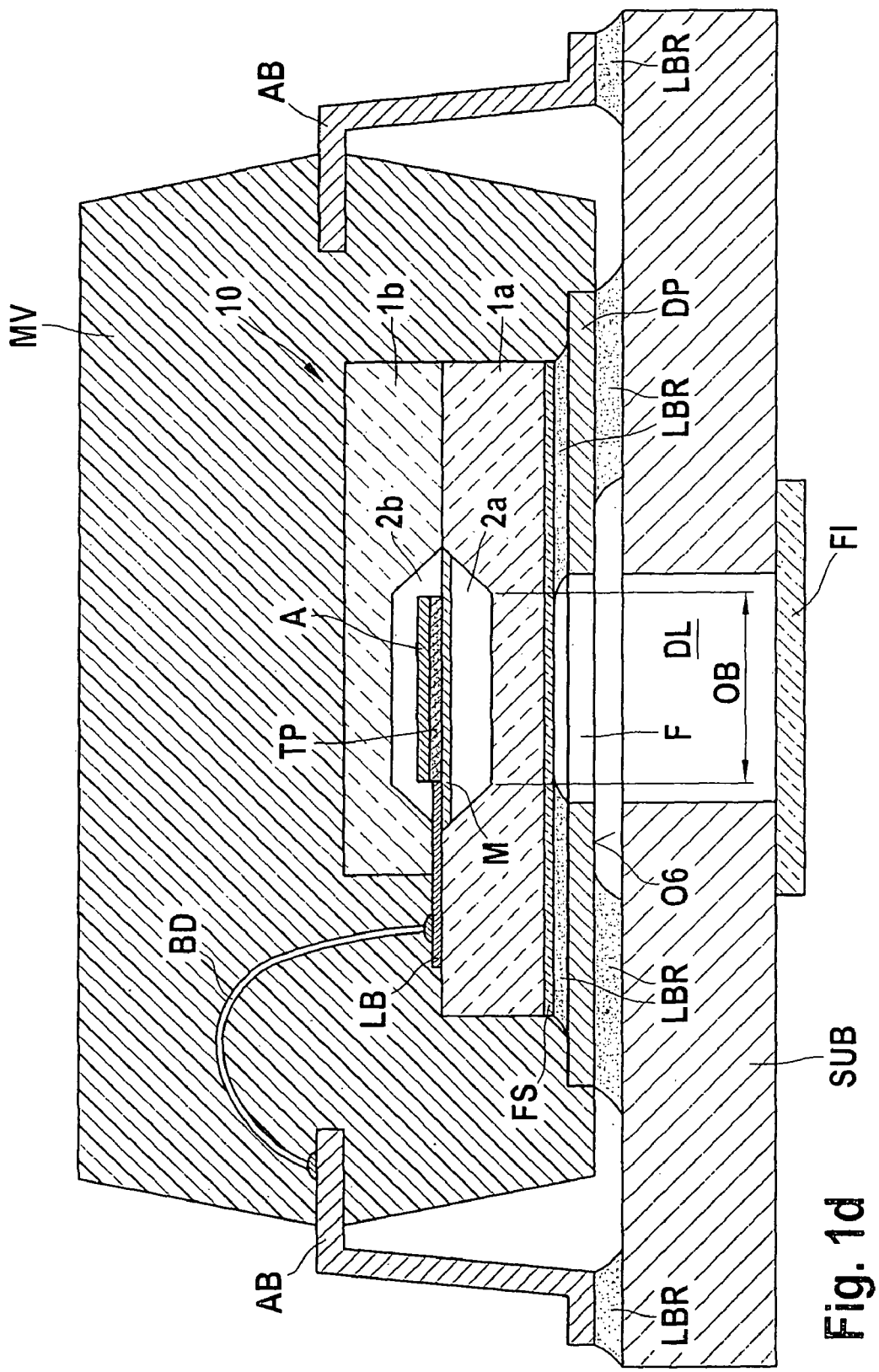

Referring now to FIG. 1d, sensor assemblage 10 packaged in this fashion can be soldered onto a substrate SUB that has a corresponding through hole DL in the region of window F. Corresponding soldering regions LBR can be provided not only on contact elements AB but also on the exposed lower surface O6 of chip receiving region DP; this additionally enhances the stability of the assemblage and ensures good thermal contact with substrate SUB. This possibility of additionally soldering or adhesively bonding the packaged sensor assemblage at chip receiving region DP that is exposed on surface O6 brings about not only greater stability but also better dynamic coupling to substrate SUB.

Furthermore, an additional filter device FI can optionally be provided on a surface of substrate SUB and in through hole DL. This additional filter device can also, for example, be configured replaceably or adjustably, thus additionally enhancing the flexibility of the sensor assemblage.

Figure 2A:
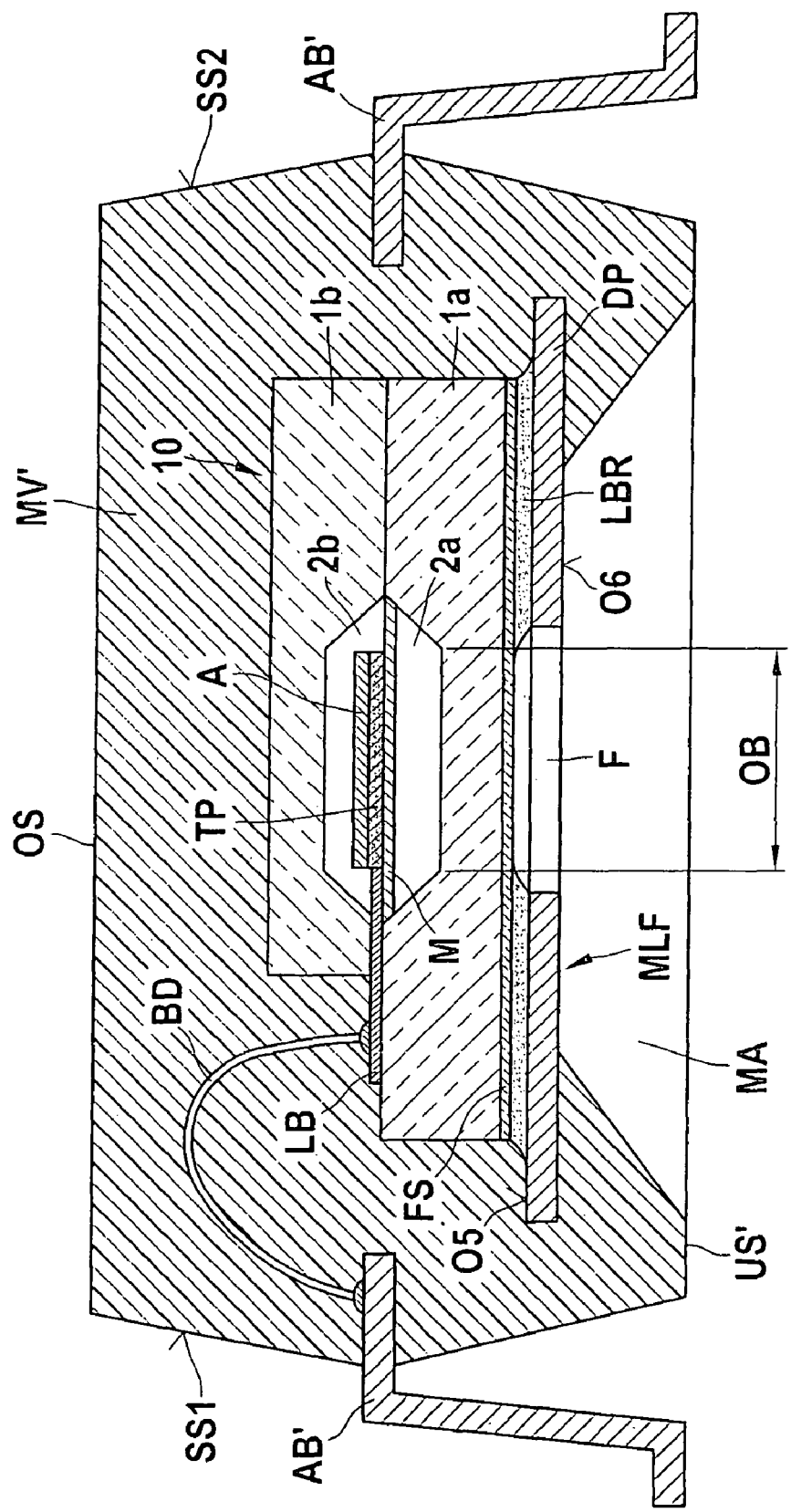
FIGS. 2a, b show a second embodiment of the sensor apparatus according to the present invention and its configuration.

FIGS. 2a, b show a second embodiment of the sensor apparatus according to the present invention and its configuration.

In the second embodiment shown in FIG. 2a, molded package MV' is configured differently than in the first embodiment according to FIG. 1c. In particular, molded package MV' here has a lower side US' that lies in a lower plane than lower surface O6 of chip receiving region DP, which in turn is also partially covered by molded package MV'.

In this embodiment as well, lower side US' of molded package MV' is substantially in one plane with the ends of connector elements AB', and leaves at least window F in optical irradiation region OB of sensor assemblage 10 exposed through an opening MA. In terms of method, lower surface O6 of chip receiving region DP can be left exposed by providing an appropriate male die on the molding tool in this region during molding, chips 1a, 1b being protected from the male die by mounting frame MLF.

Figure 2B:
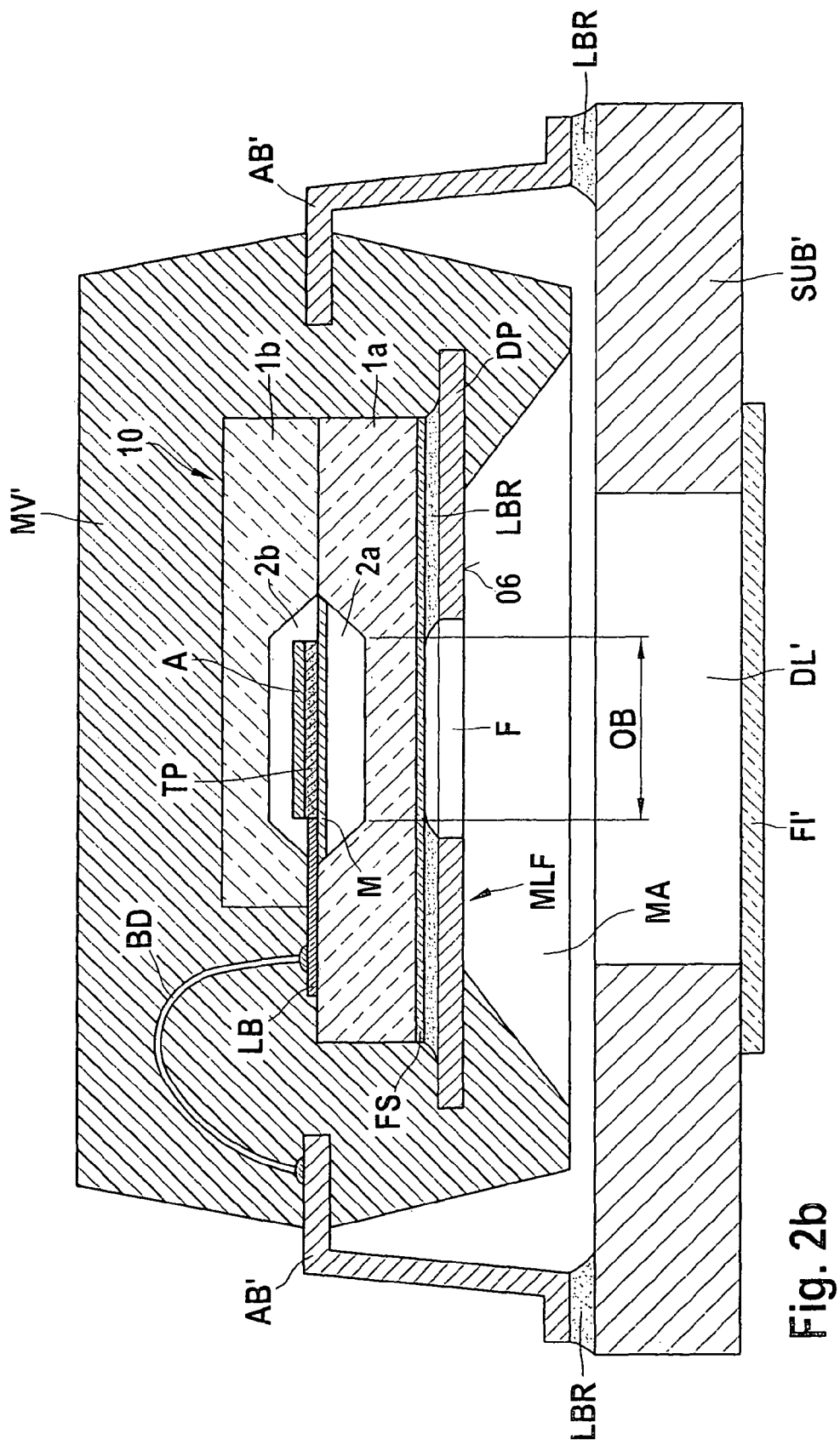

Referring to FIG. 2b, this assemblage can once again be mounted, by way of corresponding soldering regions LBR, via connector elements AB', onto a substrate SUB' that can have a corresponding filter device FI'. In the exemplifying embodiment according to FIG. 2b, through hole DL' of substrate SUB' is provided with a larger diameter than in the first embodiment above, which increases the solid angle for irradiation of optical irradiation region OB.

FIGS. 3a-d show a third embodiment of the sensor apparatus according to the present invention and its configuration.

The third embodiment of the present invention shown in FIG. 3a differs from the first and second embodiments explained above especially in that optical irradiation region OB' is located on fourth surface O4 of second chip 1b, i.e. on the latter's upper surface. In this third embodiment, absorber layer A is therefore irradiated in the usual fashion. What results accordingly is an annular, asymmetrical mounting region RB' that surrounds optical irradiation region OB. Also in this embodiment, filter layers FS' are provided not on second surface O2 but, corresponding to optical irradiation region OB', on fourth surface O4. The further components of FIG. 3a otherwise correspond to the components already explained in connection with FIG. 1a.

Optical irradiation region OB', mounting region RB' that surrounds the latter (asymmetrically in some circumstances), and wire-bond region BB are evident in the plan view of this sensor apparatus from above as shown in FIG. 3b, respective enlarged wire-bond regions BP1, BP2, BP3 (also called "bonding pads") being provided at the ends of conductor paths LB.

Figure 3C:
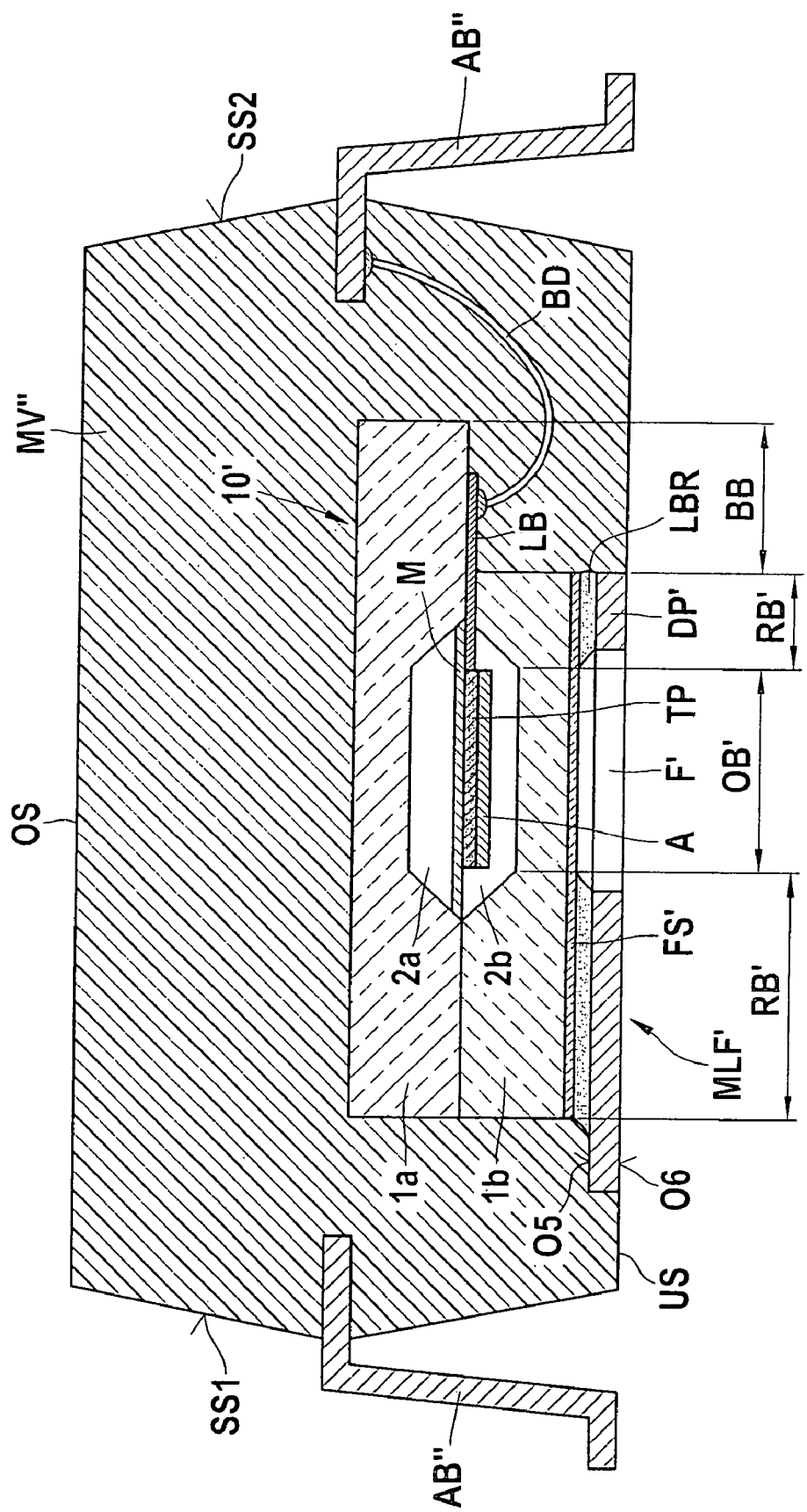

As depicted in FIG. 3c, analogously to the first embodiment according to FIG. 1c fourth surface O4 is mounted, via filter region FS' and a mounting region LBR (adhesive bonding or soldering) onto chip receiving region DP' in such a way that window F' of chip receiving region DP' leaves optical irradiation window OB' of sensor assemblage 10' exposed.

As is clearly evident from FIG. 3c, asymmetrical mounting region RB' causes the orientation of window F' in chip receiving region DP' also to be disposed asymmetrically with respect to the latter's center. Wire-bond region BB, in particular, is offset laterally with respect to chip receiving region DP' in order to make possible contacting of connector element AB" in simple fashion by bonding wire BD.

After assembly of the chip and contacting with wires, injection-embedding into molded package MV" is accomplished analogously to the first embodiment according to FIG. 1c; once again, lower surface O6 of chip attachment region DP' extends in one plane with lower side US of molded package MV" and is completely exposed. Connector elements AB" also extend at their ends in the region of this plane per JEDEC standard, as is clearly apparent from FIG. 3c.

Figure 3D:
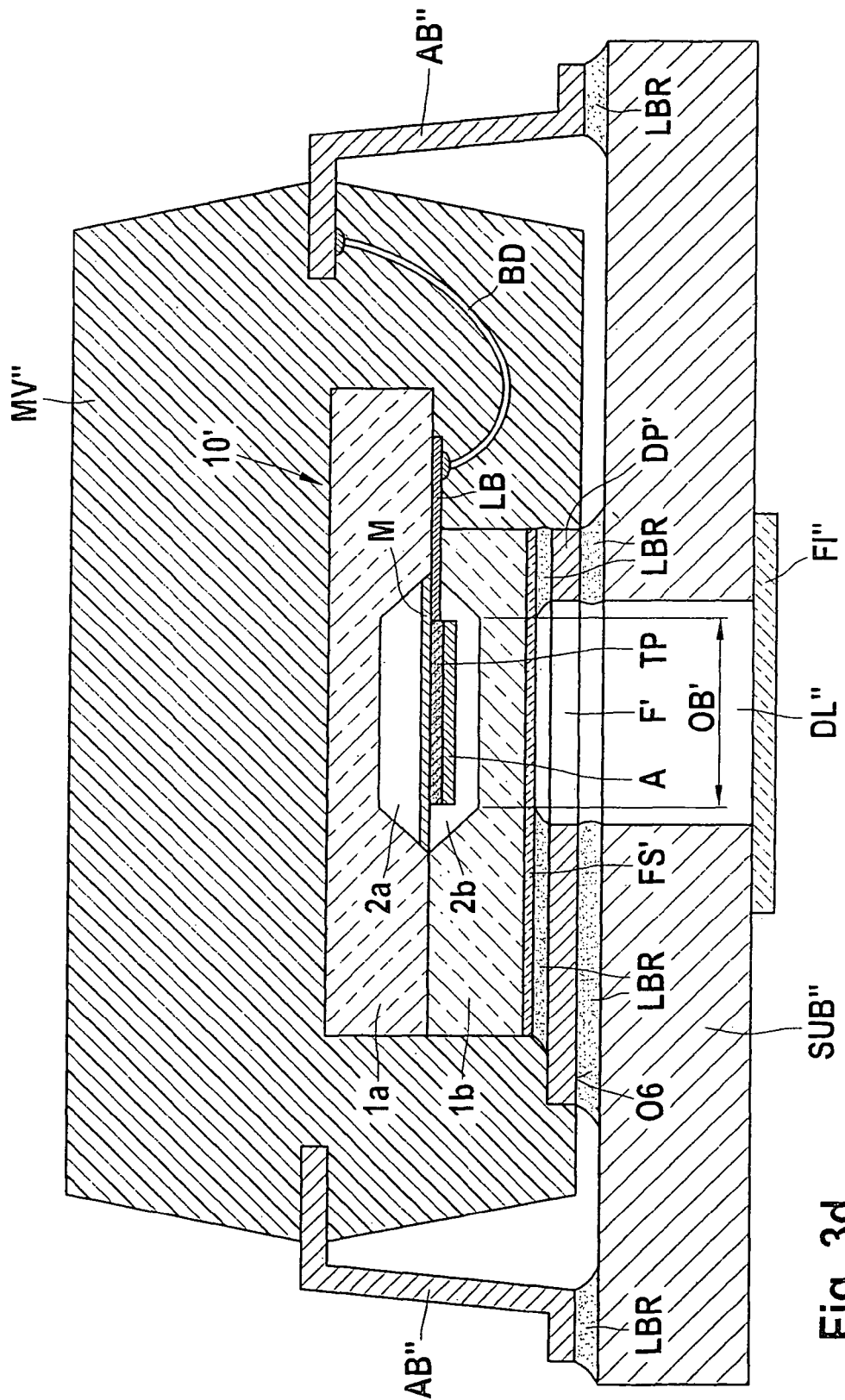

Referring to FIG. 3d, the chip assemblage constructed in this fashion is mounted on a substrate SUB" having a through opening DL" analogous to the through opening shown in FIG. 1d. Joining is accomplished via soldering regions LBR between connector elements RB" and substrate SUB", and optionally between surface O6 of chip receiving region DP' and substrate SUB".

An optional filter device FI" is also provided on the side of substrate SUB" facing away from chip assemblage 10'.

Figure 4A:
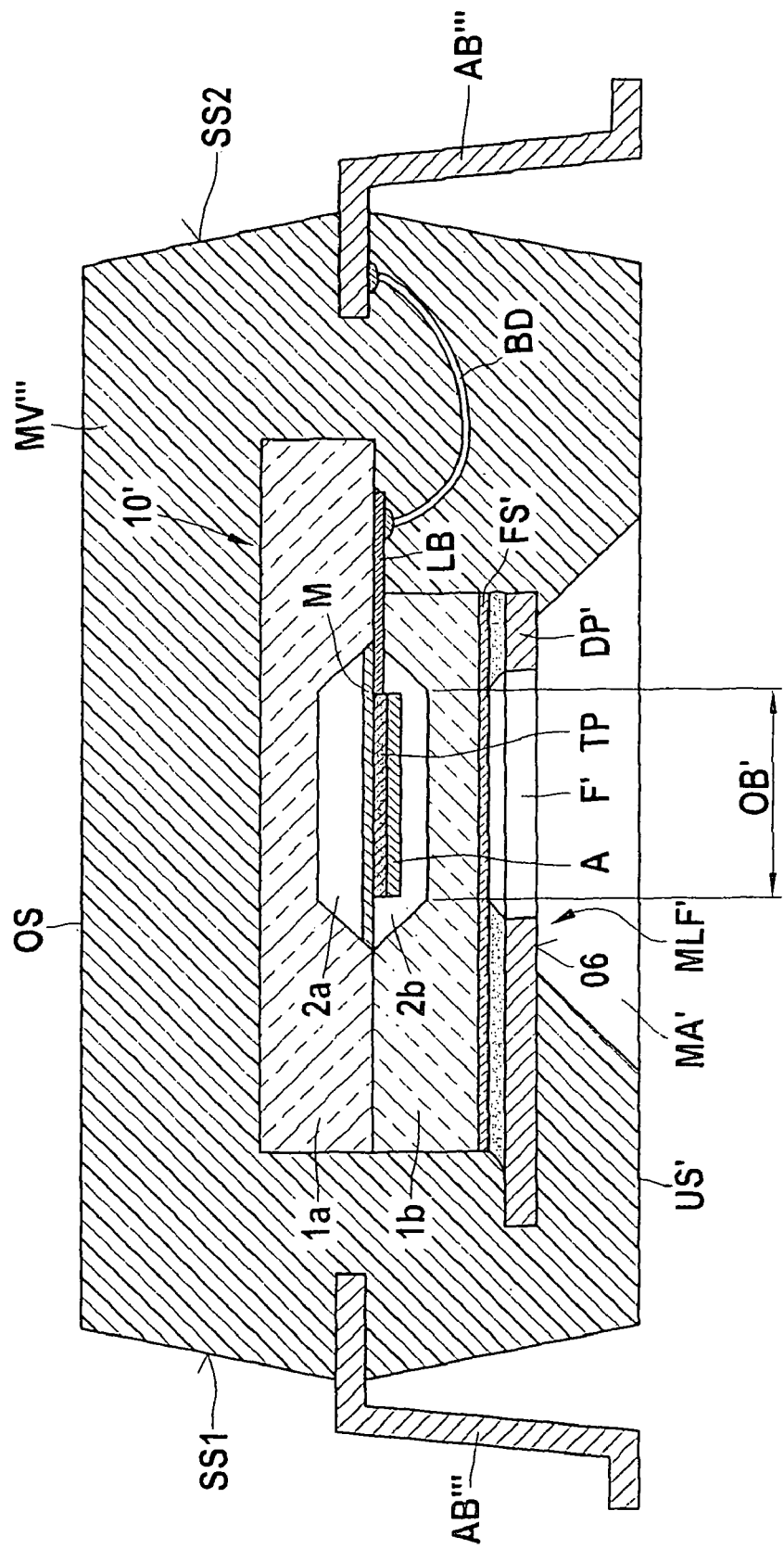
FIGS. 4a, b show a fourth embodiment of the sensor apparatus according to the present invention and its configuration.

FIGS. 4a, b show a fourth embodiment of the sensor apparatus according to the present invention and its configuration.

Referring to FIG. 4a, in this fourth embodiment lower side US' extends in a plane below surface O6 of chip receiving region DP'. An opening MA' in molded package MV''', which leaves window F' and thus optical irradiation region OB' exposed, is correspondingly provided.

Figure 4B:
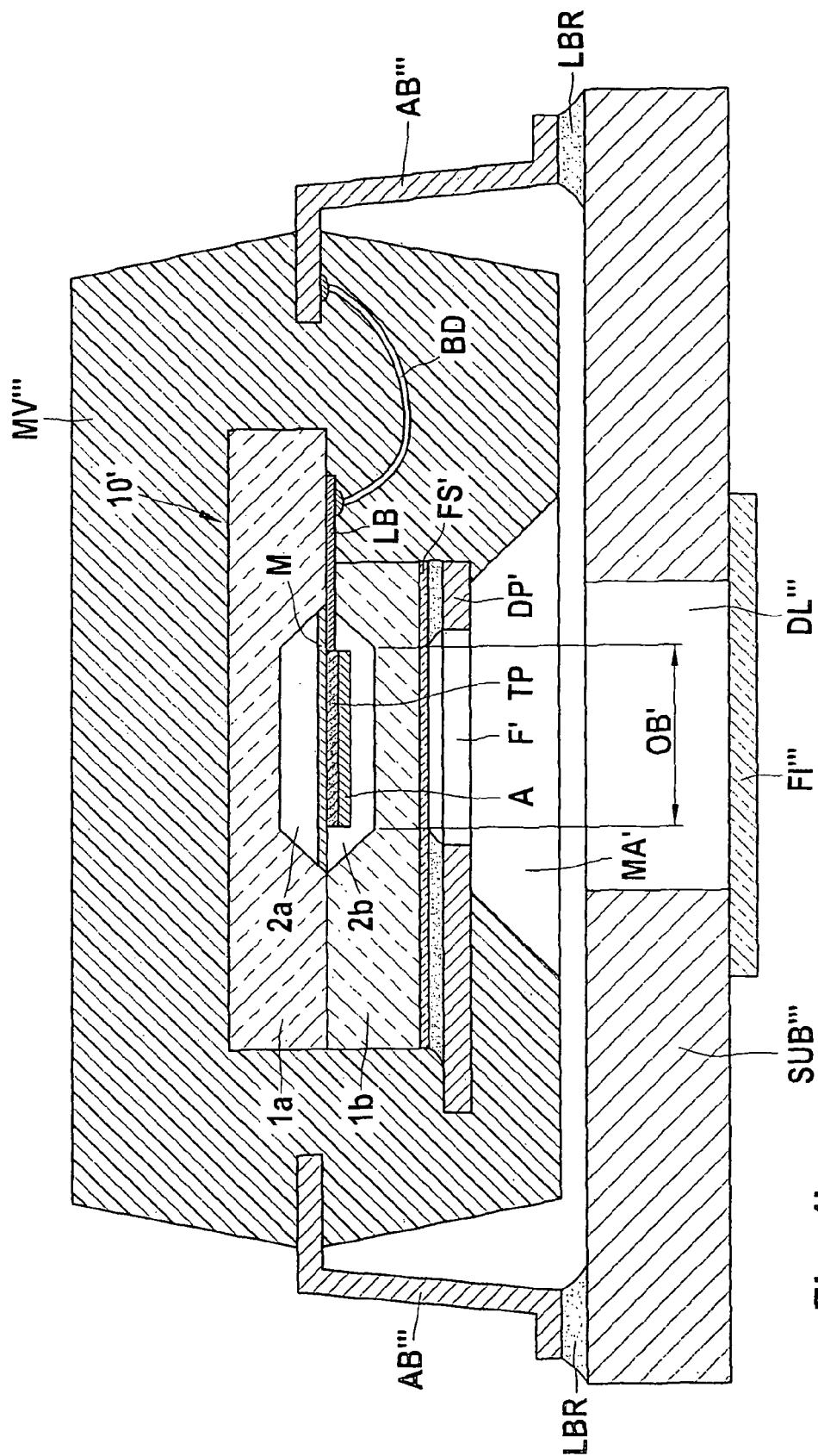

Lastly, referring to FIG. 4b, with this embodiment a mounting of the packaged chip assemblage 10' onto a substrate SUB''' is performed, analogously with FIG. 3b, via connector elements AB''' and soldering regions LBR.

Here as well, filter device FI''' is provided on the side of the substrate facing away from the chip assemblage.

Although the present invention has been described above with reference to a preferred exemplifying embodiment, it is not limited thereto but rather is modifiable in multifarious ways.

Although not shown in the above embodiment, the connector elements can of course be oriented in any desired directions with respect to chip receiving region DP, so that a "reverse" mounting on the substrate is also possible and the substrate does not require a window.

It is also possible for the chip assemblage to be not soldered, but rather adhesively bonded, onto the mounting frame.

Alternative or additional filter assemblages can furthermore be applied onto the exposed surface of the chip receiving region.

LIST OF REFERENCE CHARACTERS

BB Wire-bond region
OB, OB' Optical irradiation region
RB, RB' Mounting region
10, 10' Sensor chip assemblage
1a, 1b First, second chip
2a, b Cavity
O1-O6 Surfaces
M Membrane
TP Thermopile sensors
A Absorber layer
FS, FS' Filter layer
LBR Soldering region
MLF, MLF' Mounting frame
DP, DP' Chip receiving region
AB-AB''' Connector elements
MV-MV''' Molded package
BD Bonding wire
US, US' Lower side
OS Upper side
SS1, SS2 Lateral surfaces
F, F' Window
DL-DL''' Through hole
MA, MA' Opening
SUB-SUB''' Substrate
FI-FI''' Filter device BP1-BP3 Bonding surfaces
LB Conductor path

What is claimed is:

1. An optical sensor assemblage, comprising:
a sensor chip assemblage including an optically transparent irradiation region, a mounting region surrounding the optically transparent irradiation region, and a wire-bond region;
an optically isolating mounting frame including a chip receiving region and a plurality of connector elements; and
an optically isolating packaging device;
wherein:
the sensor chip assemblage is joined in the mounting region to the chip receiving region, and in the wire-bond region to at least one of the connector elements,
the chip receiving region includes a window disposed in such a way that at least a portion of the optically transparent irradiation region is not covered by the chip receiving region,
the optically isolating packaging device surrounds the sensor chip assemblage and the optically isolating mounting frame in such a way that optical radiation can enter the sensor chip assemblage substantially only through the window
the sensor chip assemblage includes a first chip and a second chip,
the first chip includes a first surface and a second surface oppositely located to the first surface,
the second chip includes a third surface and a fourth surface oppositely located to the third surface,
the first chip and the second chip are joined via the first surface and the third surface,
the first chip and the second chip enclose a cavity in which a sensor is disposed,
the first chip includes on the first surface the wire-bond region,
the wire-bond region protrudes laterally beyond the second chip, and
at least another of the connector elements is bonded onto the wire-bond region with a bonding pad at an end of a conductor path.

2. The optical sensor assemblage as recited in claim 1, wherein the optically transparent irradiation region and the mounting region are provided on the second surface of the first chip.

3. The optical sensor assemblage as recited in claim 1, wherein the optically transparent irradiation region and the mounting region are provided on the fourth surface of the second chip.

4. The optical sensor assemblage as recited in claim 2, wherein:
the chip receiving region includes a fifth surface and a sixth surface oppositely located to the fifth surface, and
the fifth surface is joined to the mounting region.

5. The optical sensor assemblage as recited in claim 4, wherein:
the sixth surface is not covered by the optically isolating packaging device, and
the sixth surface lies in a plane of a lower side of the optically isolating packaging device.

6. The optical sensor assemblage as recited in claim 5, wherein:
the connector elements protrude out of oppositely located lateral surfaces of the optically isolating packaging device, and
ends of the connector elements lie in the plane of the lower side.

7. The optical sensor assemblage as recited in claim 6, further comprising:
a substrate that includes a through-hole in a region of the window, wherein:
the ends of the connector elements and the sixth surface are joined to the substrate.

8. The optical sensor assemblage as recited in claim 4, wherein:
the sixth surface is partially covered by the optically isolating packaging device, and a lower side of the optically isolating packaging device lies in a plane below the sixth surface.

9. The optical sensor assemblage as recited in claim 8, wherein:
the connector elements project out of oppositely located lateral surfaces of the optically isolating packaging device, and ends of the connector elements lie in the plane of the lower side.

10. The optical sensor assemblage as recited in claim 9, further comprising:
a substrate that includes a through-hole in a region of the window, wherein: the ends of the connector elements are joined to the substrate.

11. The optical sensor assemblage as recited in claim 10, further comprising:
an optical filter device provided on at least one of the substrate in a region of the through-hole and one of the second surface and the fourth surface.

12. The optical sensor assemblage as recited in claim 1, wherein the optically isolating mounting frame includes a solder frame.

13. The optical sensor assemblage as recited in claim 3, wherein the wire-bond region projects laterally beyond the chip receiving region.

14. The optical sensor assemblage as recited in claim 1, wherein the optically isolating mounting frame is metallic.

15. A method for manufacturing an optical sensor assemblage including a sensor chip assemblage, an optically isolating mounting frame, and an optically isolating packaging device, the method comprising:
joining the sensor chip assemblage to a chip receiving region of then optically isolating mounting frame, and to at least one connector elements of the optically isolating mounting frame;
wherein:
the sensor chip assemblage includes an optically transparent irradiation region, a mounting region surrounding the optically transparent irradiation region, a wire-bond region, a first chip, and a second chip;
the joining of the sensor chip to the chip receiving region is in the mounting region;
the joining of the sensor chip to the at least one connector elements is in the wire-bond region;
the chip receiving region includes a window disposed in such a way that at least a portion of the optically transparent irradiation region is not covered by the chip receiving region,
the optically isolating packaging device surrounds the sensor chip assemblage and the optically isolating mounting frame in such a way that optical radiation can enter the sensor chip assemblage substantially only through the window
the first chip includes a first surface and a second surface oppositely located to the first surface, the second chip includes a third surface and a fourth surface oppositely located to the third surface, the first chip and the second chip are joined via the first surface and the third surface the first chip and the second chip enclose a cavity in which a sensor is disposed, the first chip includes on the first surface the wire-bond region, the wire-bond region protrudes laterally beyond the second chip, and at least another of the connector elements is bonded onto the wire-bond region with a bonding pad at an end of a conductor path.

16. The optical sensor assemblage as recited in claim 1, wherein the optical sensor assemblage includes a thermopile sensor assemblage.

17. The method as recited in claim 15, wherein the optically isolating mounting frame is metallic.

18. The method as recited in claim 15, further comprising: applying the packaging device in a molding process.

\* \* \* \* \*